United States Patent
Reder et al.

(10) Patent No.: US 6,574,525 B1
(45) Date of Patent: Jun. 3, 2003

(54) IN SITU MEASUREMENT

(75) Inventors: Steven E. Reder, Boring, OR (US); Hemanshu D. Bhatt, Penang (MY)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/105,483

(22) Filed: Mar. 25, 2002

(51) Int. Cl.[7] .......................... G06F 19/00; H01L 21/00
(52) U.S. Cl. ........................... 700/121; 700/95; 438/5; 438/7; 438/14; 427/10
(58) Field of Search .................... 700/95, 117, 121; 438/5, 7–9, 14, 16; 427/10; 324/71.5

(56) References Cited

U.S. PATENT DOCUMENTS

| | | | |
|---|---|---|---|
| 5,091,320 A | * 2/1992 | Aspnes et al. ................ | 427/8 |
| 5,313,044 A | 5/1994 | Massoud et al. ....... | 219/121.85 |
| 5,315,092 A | * 5/1994 | Takahashi et al. .......... | 219/497 |
| 5,949,927 A | 9/1999 | Tang ............................. | 385/12 |
| 6,129,807 A | 10/2000 | Grimbergen et al. ........ | 156/345 |
| 6,161,054 A | 12/2000 | Rosenthal et al. ........... | 700/121 |
| 6,245,585 B1 | * 6/2001 | Fujimoto ..................... | 438/14 |
| 6,350,361 B1 | * 2/2002 | Sexton et al. .................. | 205/82 |
| 6,472,237 B1 | * 10/2002 | Frisa et al. .................... | 438/14 |

* cited by examiner

Primary Examiner—Jayprakash N. Gandhi
(74) Attorney, Agent, or Firm—Luedeka, Neely & Graham, P.C.

(57) ABSTRACT

A reaction chamber of the type used to create a reaction at a surface of a substrate disposed within the reaction chamber. A transmitter produces a transmitted beam having first characteristics, where the transmitter is disposed outside of the reaction chamber. A view port is disposed in a boundary wall of the reaction chamber, where the view port is formed of a material that is transparent at least in part to the transmitted beam. The transmitter, the view port, and the substrate are aligned such that the transmitted beam is directable to and reflected at least in part from the surface of the substrate, thereby producing a reflected beam having second characteristics. A receiver is disposed outside of the reaction chamber, and the receiver receives the reflected beam from the surface of the substrate through the view port. The receiver also senses the second characteristics of the reflected beam and reports the second characteristics. A controller receives the second characteristics from the receiver and compares the second characteristics to the first characteristics to determine a difference between the first characteristics and the second characteristics. The difference relates to a progress of the reaction at the surface of the substrate. The controller also reports the progress of the reaction. A view port shield shields the view port from the reaction without substantially inhibiting the transmitted beam from reaching the surface of the substrate and the reflected beam from reaching the receiver. The transmitted beam is produced by the transmitter and the reflected beam is received and sensed by the receiver and the controller determines the progress of the reaction while the reaction is conducted.

20 Claims, 2 Drawing Sheets

IN SITU MEASUREMENT

FIELD

This invention relates to the field of process control. More particularly, this invention relates to sensing the progress of a reaction at the surface of a substrate from outside of the reaction chamber in which the reaction takes place, and controlling the reaction based at least in part upon the sensed progress of the reaction.

BACKGROUND

Monolithic integrated circuits are typically formed in a series of steps in which layers of different materials are sequentially formed and selectively removed from portions of an underlying substrate. As the technology of integrated circuit fabrication has evolved, the desired thickness for many of the layers that are formed has decreased, thus producing integrated circuits that are generally more sensitive in nature than their predecessors. Commensurately, the thickness tolerances for these thinner layers have also decreased. This evolution has produced at least two ever more stringent conditions for integrated circuit processing. First, that layers are formed to proper thicknesses, and second that the etch processes used to selectively remove certain layers do so without either under etching or over etching the layer to be removed.

As to the first condition, devices designed to work with thinner layers tend to be more sensitive to variances in layer thickness. In other words, if a layer is specified to be a certain thickness, and a five percent variation in thickness is acceptable, the amount of actual variation in the thickness of the layer is less for a relatively thinner layer of material than it is for a relatively thicker layer of material. Thus, the processes and equipment used to form the relatively thinner layer require a greater degree of control than do those used to form the relatively thicker layer.

As to the second condition, under etching a relatively thinner layer of material may, in certain applications, have a greater negative effect on an integrated circuit than does under etching a relatively thicker layer of material. One reason for this is that, as mentioned above, an integrated circuit that is designed for use with the relatively thinner layer tends to be a more sensitive device, and is therefore more sensitive to small amounts of material that are left behind when a layer is under etched. On the other hand, an integrated circuit that is designed for use with the relatively thicker layer tends to be more tolerant under certain circumstances to small amounts of material that are left behind when a layer is under etched.

Similarly, in an over etch condition, a relatively thinner layer that underlies an etched layer is impacted to a greater degree than is a relatively thicker layer that underlies an etched layer. For example, although the same thickness of material may be removed from both the underlying relatively thinner layer and the underlying relatively thicker layer in each case, that same thickness of over etched material represents a greater percentage of the entire thickness of the relatively thinner layer, and thus tends to have a greater effect on the more sensitive integrated circuit. By contrast, that same thickness of over etched material represents a smaller percentage of the entire thickness of the relatively thicker layer, and thus tends to have a smaller effect on a less sensitive integrated circuit.

For these and other reasons there is a need for a system to more precisely monitor and control the processes by which integrated circuits are formed.

SUMMARY

The above and other needs are met by a reaction chamber of the type used to create a reaction at a surface of a substrate disposed within the reaction chamber. A transmitter produces a transmitted beam having first characteristics, where the transmitter is disposed outside of the reaction chamber. A view port is disposed in a boundary wall of the reaction chamber, where the view port is formed of a material that is transparent at least in part to the transmitted beam. The transmitter, the view port, and the substrate are aligned such that the transmitted beam is directable to and reflected at least in part from the surface of the substrate, thereby producing a reflected beam having second characteristics.

A receiver is disposed outside of the reaction chamber, and the receiver receives the reflected beam from the surface of the substrate through the view port. The receiver also senses the second characteristics of the reflected beam and reports the second characteristics. A controller receives the second characteristics from the receiver and compares the second characteristics to the first characteristics to determine a difference between the first characteristics and the second characteristics. The difference relates to a progress of the reaction at the surface of the substrate. The controller also reports the progress of the reaction. A view port shield shields the view port from the reaction without substantially inhibiting the transmitted beam from reaching the surface of the substrate and the reflected beam from reaching the receiver. The transmitted beam is produced by the transmitter and the reflected beam is received and sensed by the receiver and the controller determines the progress of the reaction while the reaction is conducted.

In this manner the reaction is preferably continuously monitored to determine the progress of the reaction, and the controller can report the progress of the reaction so that it can be stopped when the reaction has proceeded to a desired point. By having the transmitter, receiver, and controller disposed outside of the reaction chamber, they are protected from the effects of the reaction, such as deposition or etch reactions. Further, the transparent view port is also protected from the effects of the reaction by the view port shield, which allows the transmitted beam and the reflected beam to pass through the view port shield without substantially inhibiting or altering the characteristics of the beams over time, and thus allows for continuous monitoring of the progress of the reaction.

In various preferred embodiments of an apparatus according to the present invention, the view port shield is a gas purge across an interior surface of the view port, where the gas is inert to the reaction. For example, the view port shield can be a nitrogen gas purge or an argon gas purge across an interior surface of the view port. In a most preferred embodiment, the transmitter, the receiver, and the controller are an ellipsometer. The transmitted beam can be visible light or a penetrating electromagnetic radiation. The view port is preferably formed of one of quartz and sapphire. The controller most preferably compares the progress of the reaction to a set point, and stops the reaction when the progress of the reaction is substantially equal to the set point. Further, the controller preferably displays the progress of the reaction as a numeric value, such as a thickness.

According to another aspect of the invention there is provided an improvement to a method for conducting a reaction at a surface of a substrate disposed within a reaction chamber. A transmitted beam having first characteristics is produced with a transmitter disposed outside of the reaction chamber. The transmitted beam is directed onto the surface of the substrate through a view port in a boundary wall of the reaction chamber. The view port is formed of a material that is transparent at least in part to the transmitted beam.

The transmitted beam is reflected at least in part from the surface of the substrate, thereby producing a reflected beam having second characteristics, which is received from the surface of the substrate through the view port with a receiver disposed outside of the reaction chamber. The second characteristics of the reflected beam are sensed and reported by the receiver. The second characteristics are received from the receiver with a controller. The second characteristics are compared to the first characteristics and a difference is determined between the first characteristics and the second characteristics. The difference relates to a progress of the reaction at the surface of the substrate. The progress of the reaction is reported by the controller.

The view port is shielded from the reaction with a view port shield, without substantially inhibiting the transmitted beam from reaching the surface of the substrate and the reflected beam from reaching the receiver. The steps of producing the transmitted beam, receiving and sensing the reflected beam, and determining the progress of the reaction are accomplished while the reaction is conducted.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
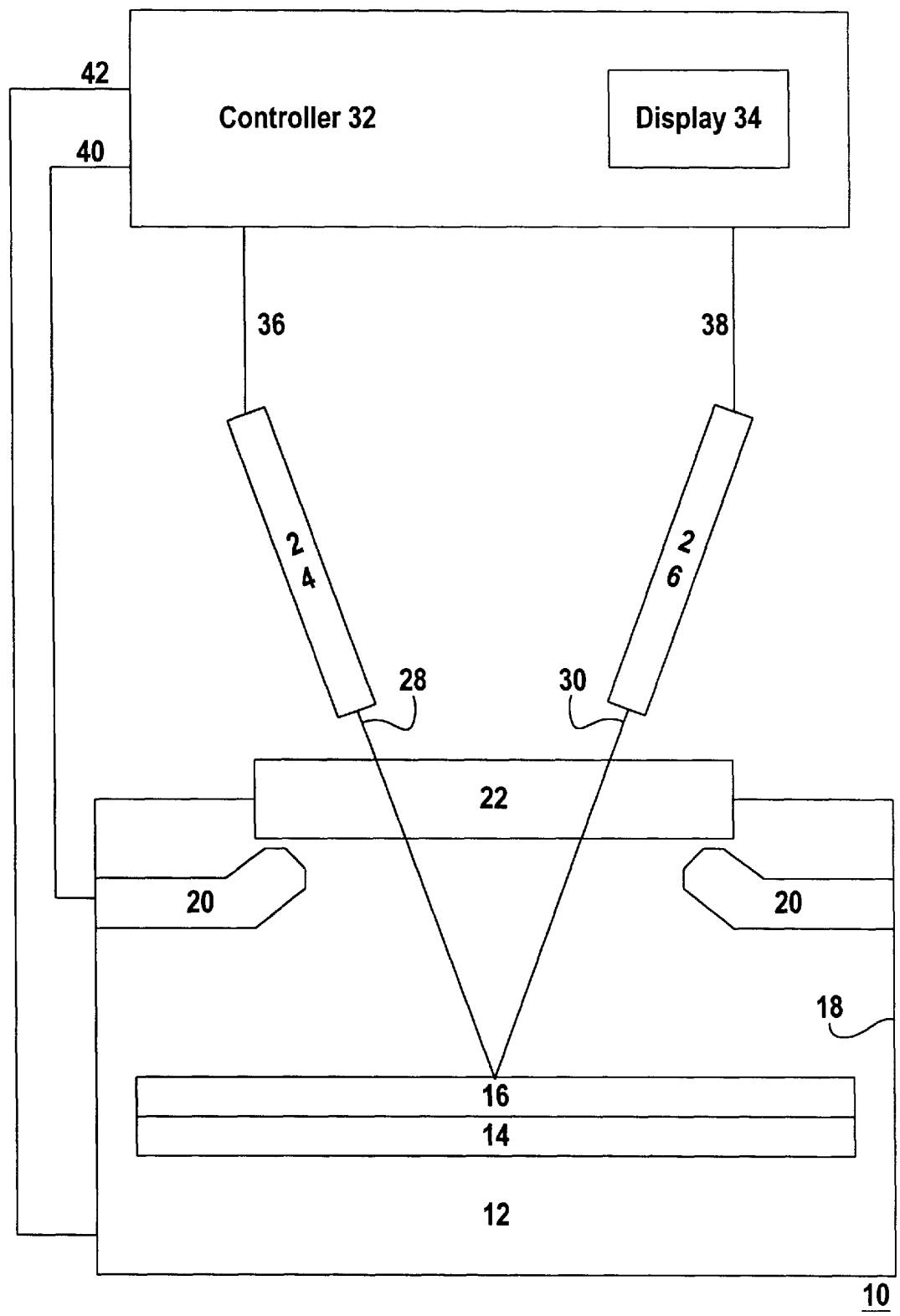
FIG. 1 is a functional block diagram of a preferred apparatus according to the present invention, depicting a first embodiment of the transmitted and reflected beams.

With reference now to FIG. 1, there is depicted a reactor 10 according to the present invention. The reactor 10 is of the type that is used for processing substrates 14, such as semiconductor substrates 14 in the microelectronics industry. Thus, the reactor 10 may be one in which a layer is either formed or thinned, but may also include multi purpose reactor chambers, thermal annealing chambers, out gassing chambers and other such as are known in the industry and are compatible with the materials, functions, and methods as described herein.

The reactor 10 preferably has a reaction chamber 12 which encloses a space in which a controlled environment may be established. The reactor 10 creates and maintains conditions within the environment of the reaction chamber 12 that are amenable and preferably optimal for the reaction desired within the reaction chamber 12. For example, the reactor 10 preferably controls physical parameters within the reaction chamber 12 such as temperature, pressure, gas flow, electromagnetic field, and other such parameters.

The reaction chamber 12 is preferably bounded by a boundary wall 18, which encloses the reactor chamber 12 and separates it from an ambient environment. The boundary wall 18 is preferably formed of a resilient material that is relatively inert to the reactions that are conducted within the reaction chamber 12. For example, a high grade of stainless steel is a preferred material for the boundary wall 18, because it can be cleaned relatively easily, can form a wall with a high degree of structural strength, tends to not react with many of the reactions that are used in the microelectronics industry, and exhibits a low degree of out gassing of impurities. However, dependent upon the desired reaction within the reaction chamber 12, other materials may be more appropriate for use as the boundary wall 18, such as vitreous ceramic, quartz, or sapphire.

According to one embodiment of the invention, as the substrate 14 is processed, a layer 16 disposed on the surface of the substrate 14 is altered in some manner. In a first embodiment, the layer 16 does not exist at the beginning of the reaction, and then as the reaction commences the layer 16 is formed on the surface of the substrate 14, and grows thicker as the reaction progresses. In a second embodiment, the layer 16 already exists at the beginning of the reaction, and then as the reaction commences the layer 16 is thinned, such as in unprotected areas of the layer 16 that are exposed through a photoresist or other mask, and the layer 16 is removed in those exposed portions as the reaction progresses. In a most preferred embodiment the reaction is a layer formation reaction, where the layer 16 grows thicker as the reaction progresses.

The layer 16 may be formed of a variety of different materials, such as semiconductor materials like silicon or germanium, or conductors such as titanium, tantalum, gold, copper, or aluminum, or nonconductors such as oxides and nitrides. Thus, the layer 16 may have a surface that is either highly transparent or highly reflective, or somewhere in between. In a most preferred embodiment of the invention, the layer 16 is formed of a relatively transparent silicon oxide, such as silicon dioxide.

As mentioned above, it is desirable to control such reactions with as high a degree of precision as is practical under the circumstances. To this end the reactor 10 of the present invention includes measurement and control equipment that monitor the progress of the reaction within the reactor chamber 12, and most preferably either report the progress of the reaction or halt the reaction when the desired end point has been achieved. The preferred components and operation of such equipment are now described.

A transmitter 24 is disposed outside of the reaction chamber 12. By placing the transmitter 24 outside of the reaction chamber 12, the environment within the reaction chamber 12, which as described above may be quite sensitive to contaminants, is more easily maintained in a known and desirable condition. Further, the components of the transmitter 24 are in this manner not subjected to the environment within the reaction chamber 12, which may be detrimental to the proper operation and longevity of the components of the transmitter 24. Further, by disposing the transmitter 24 outside of the reaction chamber 12, the transmitter 24 is more easily replaced with transmitters of other types when so desired, as is described in more detail below.

Preferably, the transmitter 24 directs a transmitted beam 28 toward the surface of the substrate 14. As the boundary wall 18 of the reactor 10 may not be formed of a material that allows such transmission of the transmitted beam 28 between the transmitter 24 and the surface of the substrate 14, there is preferably provided a view port 22 within the boundary wall 18 of the reactor 10. The view port 22 is preferably formed of a material that is transparent, at least in part, to the transmitted beam 28. In addition, the view port 22 is preferably formed of a material that does not substantially and negatively impact the structure of the reactor 10, or compromise the integrity of the environment within the reaction chamber 12. Most preferably the view port 22 is formed of quartz or sapphire.

In some embodiments the boundary wall 18 may be formed of a material that is sufficiently transparent to the transmitted beam 28. In such a case, a view port 22 as a separate structure is not necessary. Rather the view port 22 would be that portion of the boundary wall 18 through which the transmitted beam 28 is directed, with other considerations as described in more detail below.

Figure 2:
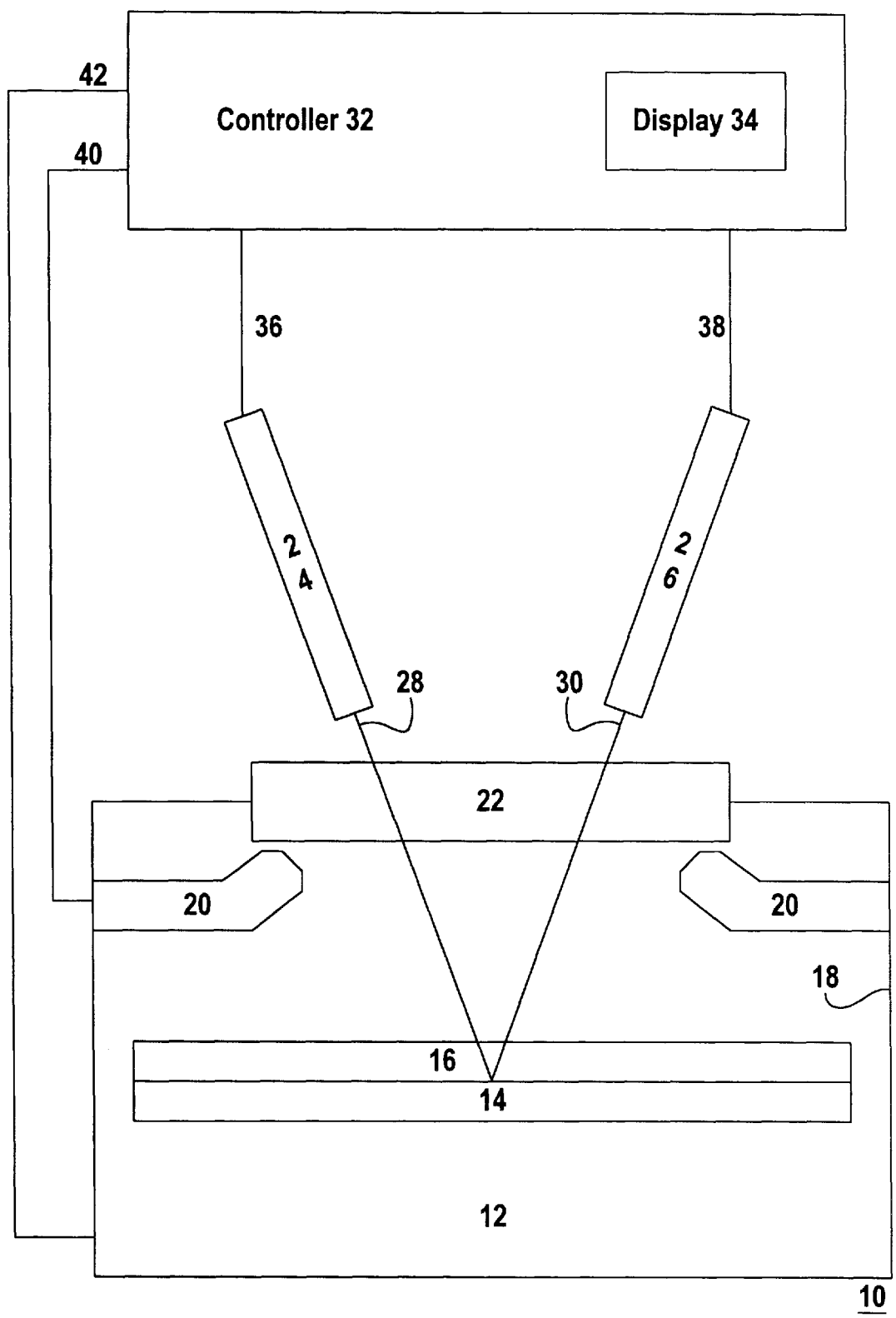
FIG. 2 is a functional block diagram of the preferred apparatus according to the present invention, depicting a second embodiment of the transmitted and reflected beams.

The transmitted beam 28 reflects off of the surface of the substrate 14, resulting in a reflected beam 30. As depicted in FIG. 2, if the layer 16 on top of the substrate 14 is at least partially transparent to the transmitted beam 28, then at least a portion of the transmitted beam 28 will reflect off of the surface of the substrate 14. However, a component of the transmitted beam 28 may also reflect off of the surface of the overlying layer 16, as depicted in FIG. 1. If the layer 16 on top of the substrate 14 is not transparent at all to the transmitted beam 28, then the transmitted beam 28 reflects off of the surface of the layer 16, and not off of the surface of the underlying substrate 14.

Different types of transmitted beams 28 exhibit different reflectance properties. For example, transmitted beams 28 of radiation within the visible spectrum tend to pass through a transparent layer 16 and reflect in greater measure off the underlying substrate 14. However, even in this case a portion of the visible light transmitted beam 28 tends to reflect off of the surface of the transparent layer 16. In other embodiments, the transmitted beam 28 is a penetrating electromagnetic radiation that is intended to pass through the overlying layer 16 and reflect off the substrate 14. However, in this case the transmitted beam 28 may still be effected by physical characteristics of the overlying layer 16, such as the thickness of the overlying layer 16.

Thus, it is seen that there are many comprehended combinations of transmitted beams 28 and layers 16. It is appreciated that when it is said that the transmitted beam 28 is reflected by the surface of the substrate 14, such language is a short hand way of referring to all such combinations as described and anticipated by the examples above, and is not to be strictly limited to the single case in which the transmitted beam 28 is entirely reflected only by the surface of the substrate 14. However, in a most preferred embodiment, the transmitted beam 28 is formed of radiation of a range of one or more wavelengths from within the visible spectrum.

The reflected beam 30 is received by a receiver 26 through the view port 22. It is appreciated that the reflected beam 30 may pass through a second view port 22, which is separate from the view port 22 through which the transmitted beam 28 passes, and which also comprehends a second portion of the boundary wall 18, in those cases in which it is formed of a material that is reasonably transparent to the reflected beam 30. In certain embodiments a configuration with two view ports 22 may enable the view ports 22 to be smaller than would be necessary in the case where there is only a single view port 22 provided. In addition, multiple view ports 22 may make configuring the elements of the reactor 10 easier for some embodiments of the reactor 10. However, all such various combinations of layouts of the view port 22 are comprehended by the present invention.

The receiver senses the reflected beam 30, including characteristics of the reflected beam 30. The characteristics of the reflected beam 30 are sent by the receiver 26 to a controller 32, such as through line 28. The controller 32 preferably also controls the operation of the transmitter 24, such as through line 36. For example, the controller 32 preferably controls, or is at least aware of, characteristics of the transmitted beam 28.

The controller 32 preferably compares the characteristics of the transmitted beam 28 to the characteristics of the reflected beam 30 to determine a difference between the characteristics of the two beams, where the difference relates to the progress of the reaction occurring on the substrate 14 within the reaction chamber 12. For example, in the most preferred embodiment, the difference in characteristics between the transmitted beam 28 and the reflected beam 30 relates to the thickness of the silicon oxide layer 16 that is being formed on the surface of a silicon substrate 14 as the reaction progresses. Of course, the silicon substrate 14 may have many intervening layers between it and the forming layer 16 of silicon oxide.

In a most preferred embodiment, the transmitter 24, receiver 26, and controller 32 comprise portions of an ellipsometer, which is used to determine the progress of the reaction, such as the thickness of the forming silicon oxide layer 16. However, instruments that provide information in regard to the progress of such reactions based upon other principles, such as interferometry or other principles, may also be used. Equipment based upon such other principles may direct the transmitted beam 28 and the reflected beam 30 along substantially the same axis, and the transmitter 24 and the receiver 26 may be enclosed within the same housing, rather than within separate structures as depicted in the figures.

The controller 32 preferably reports the progress of the reaction, such as on a display 34. Most preferably the progress of the reaction is displayed as a numeric value, such as the thickness of the layer 16, whether that thickness be increasing during a formation reaction or decreasing during an etching reaction. In an especially preferred embodiment, the controller 32 is programmed, such as with a desired layer 16 thickness, and when it determines that such a layer 16 thickness has been achieved, the controller 32 stops the reaction within the reaction chamber 12, such as by sending a control signal on line 42 to the reactor 10.

The operation of the transmitter 24, receiver 26, and controller 32 is preferably concurrent with the reaction that occurs within the reaction chamber 12, such that the reaction can be monitored and preferably controlled in real time. In some embodiments the concurrent operation is continual, and in other embodiments the concurrent operation is intermittent, such as controlling the transmitter 24 to fire the transmitted beam 28 at discrete times in between the pulses of a plasma enhanced chemical vapor deposition reaction. In this latter mode of operation, the controller 32 computes the thickness of the oxide layer 16 being formed, for example, and if the thickness of the formed layer 16 of silicon oxide is not yet at the set point, the controller 32 sends a control signal to the reactor 10 to initiate another plasma pulse and form an additional incremental amount of silicon oxide, at which time the thickness of the layer 16 is again sensed. Thus, the controller 32 causes additional amounts to be formed if the set point has not been attained, and stops the reaction if the set point has been attained. A similar mode of operation could be used for a plasma enhanced etch reaction, and other such reactions.

The controller 32 is preferably also connected to a view port shield 20, such as by line 40. The view port shield 20 preferably functions to shield and protect the view port 22 from the reaction occurring within the reaction chamber 12, without substantially inhibiting the transmitted beam 28 from reaching the surface of the substrate 14 and the reflected beam 30 from reaching the receiver. Were it not for the view port shield 20, the reaction occurring within the reaction chamber 12 would tend to alter certain physical characteristics of the view port 22 over time, and thus effect the reliability with which the controller 32 was able to determine the progress of the reaction.

For example, during a formation reaction, the formed material would tend to form on the view port 22, thus altering the transmission characteristics of both the transmitted beam 28 and the reflected beam 30. Similarly, during an etch reaction, the view port 22 may tend to etch or be coated with the effluents of the etch reaction, again altering the transmission characteristics of both the transmitted beam 28 and the reflected beam 30, and impeding the ability of the controller 32 to accurately determine the progress of the reaction.

In a most preferred embodiment, the view port shield 20 operates by passing a gas across the inner surface of the view port 22. Most preferably the gas is relatively inert to the reaction that is conducted within the reaction chamber 12. For example, both argon and nitrogen are relatively inert to many reactions of the type mentioned above. The gas may be directed across the surface of the view port 22 such as by a series of nozzles connected to a plenum, which nozzles may be directed onto the view port 22 from multiple directions, or from a single direction.

In addition, the view port shield 20 may include ports on which a vacuum is drawn, so as to remove from the reaction chamber 12 a substantial portion of the inert gas introduced into the reaction chamber 12 by the view port shield 20, and thus decrease any effects that the inert gas may have on the reaction within the reaction chamber 12. In other embodiments, the inert gas is withdrawn from the reaction chamber 12 through an exhaust port, through which other process gasses are also withdrawn. In yet a further embodiment, the reaction precursor gases, or other carrier gases, are introduced into the reaction chamber 12 through the view port shield 20, and subsequently play a part in the desired reaction within the reaction chamber 12.

The rate of introduction and withdrawal of the inert gas that is passed across the view port 22 by the view port shield 20 is preferably balanced so as to not negatively impact the reaction in a substantial manner. For example, if one of the controlled parameters of the reaction is the pressure within the reaction chamber 12, then the introduction and withdrawal of the inert gas by the view port shield 20 is preferably balanced so as to maintain the desired pressure within the reaction chamber 12. Such parameters as these and others are preferably controlled by the controller 32.

It is appreciated that in those embodiments in which the view port 22 is one or more portions of the boundary wall 18, the view port shield 20 operates in the same manner as described above, but it directed at those one or more portions of the boundary wall 18, rather than against a separate structure. It is further appreciated that in those embodiments in which there are more than one view port 22, there are also preferably provided view port shields 20 for each such view port 22.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In a reaction chamber of the type used to create a reaction at a surface of a substrate disposed within the reaction chamber, the improvement comprising:

a transmitter for producing a transmitted beam having first characteristics, the transmitter disposed outside of the reaction chamber, a view port in a boundary wall of the reaction chamber, the view port formed of a material that is transparent at least in part to the transmitted beam, the transmitter, the view port, and the substrate aligned such that the transmitted beam is directable to and reflected at least in part from the surface of the substrate, thereby producing a reflected beam having second characteristics, a receiver disposed outside of the reaction chamber for receiving the reflected beam from the surface of the substrate through the view port, the receiver further for sensing the second characteristics of the reflected beam and reporting the second characteristics, a controller for receiving the second characteristics from the receiver and comparing the second characteristics to the first characteristics to determine a difference between the first characteristics and the second characteristics, where the difference relates to a progress of the reaction at the surface of the substrate, the controller further for reporting the progress of the reaction, and a view port shield for shielding the view port from the reaction without substantially inhibiting the transmitted beam from reaching the surface of the substrate and the reflected beam from reaching the receiver, where the transmitted beam is produced by the transmitter and the reflected beam is received and sensed by the receiver and the controller determines the progress of the reaction while the reaction is conducted.

2. The reaction chamber of claim 1, wherein the view port shield comprises a gas purge across an interior surface of the view port, where the gas is inert to the reaction.

3. The reaction chamber of claim 1, wherein the view port shield comprises a nitrogen gas purge across an interior surface of the view port, where the nitrogen gas is inert to the reaction.

4. The reaction chamber of claim 1, wherein the view port shield comprises an argon gas purge across an interior surface of the view port, where the argon gas is inert to the reaction.

5. The reaction chamber of claim 1, wherein the reaction is a layer formation reaction, such as by deposition or growing.

6. The reaction chamber of claim 1, wherein the reaction is an etch reaction.

7. The reaction chamber of claim 1, wherein the transmitter, the receiver, and the controller comprise an ellipsometer.

8. The reaction chamber of claim 1, wherein the transmitted beam comprises visible light.

9. The reaction chamber of claim 1, wherein the transmitted beam comprises penetrating electromagnetic radiation.

10. The reaction chamber of claim 1, wherein the view port is formed of one of quartz and sapphire.

11. The reaction chamber of claim 1, wherein the controller further compares the progress of the reaction to a set point, and stops the reaction when the progress of the reaction is substantially equal to the set point.

12. The reaction chamber of claim 1, wherein the controller further displays the progress of the reaction as a numeric value.

13. In a method for conducting a reaction at a surface of a substrate disposed within a reaction chamber, the improvement comprising the steps of:

producing a transmitted beam having first characteristics with a transmitter disposed outside of the reaction chamber, directing the transmitted beam onto the surface of the substrate through a view port in a boundary wall of the reaction chamber, the view port formed of a material that is transparent at least in part to the transmitted beam, reflecting the transmitted beam at least in part from the surface of the substrate, thereby producing a reflected beam having second characteristics, receiving the reflected beam from the surface of the substrate through the view port with a receiver disposed outside of the reaction chamber, sensing the second characteristics of the reflected beam and reporting the second characteristics with the receiver, receiving the second characteristics from the receiver with a controller, comparing the second characteristics to the first characteristics with the controller, determining a difference between the first characteristics and the second characteristics with the controller, where the difference relates to a progress of the reaction at the surface of the substrate, reporting the progress of the reaction with the controller, and shielding the view port from the reaction with a view port shield without substantially inhibiting the transmitted beam from reaching the surface of the substrate and the reflected beam from reaching the receiver, where the steps of producing the transmitted beam, receiving and sensing the reflected beam, and determining the progress of the reaction are accomplished while the reaction is conducted.

14. The method of claim 13, wherein the step of shielding the view port comprises passing a gas purge across an interior surface of the view port, where the gas is inert to the reaction.

15. The method of claim 13, wherein the step of shielding the view port comprises passing a nitrogen gas purge across an interior surface of the view port, where the nitrogen gas is inert to the reaction.

16. The method of claim 13, wherein the step of shielding the view port comprises passing an argon gas purge across an interior surface of the view port, where the argon gas is inert to the reaction.

17. The method of claim 13, wherein the reaction is a layer formation reaction, such as deposition or growth.

18. The method of claim 13, wherein the reaction is an etch reaction.

19. The method of claim 13, further comprising the steps of: comparing the progress of the reaction to a set point with the controller, and stopping the reaction when the progress of the reaction is substantially equal to the set point.

20. In a method for conducting an oxide formation reaction at a surface of a substrate disposed within a reaction chamber, the improvement comprising the steps of:

producing a transmitted beam having first characteristics with a transmitter disposed outside of the reaction chamber, directing the transmitted beam onto the surface of the substrate through a view port in a boundary wall of the reaction chamber, the view port formed of a material that is transparent at least in part to the transmitted beam, reflecting the transmitted beam at least in part from the surface of the substrate, thereby producing a reflected beam having second characteristics, receiving the reflected beam from the surface of the substrate through the view port with a receiver disposed outside of the reaction chamber, sensing the second characteristics of the reflected beam and reporting the second characteristics with the receiver, receiving the second characteristics from the receiver with a controller, comparing the second characteristics to the first characteristics with the controller, determining a difference between the first characteristics and the second characteristics with the controller, where the difference relates to a thickness of the oxide at the surface of the substrate, reporting the thickness of the oxide with the controller, and shielding the view port from the oxide deposition with an inert gas purge across an interior surface of the view port without substantially inhibiting the transmitted beam from reaching the surface of the substrate and the reflected beam from reaching the receiver, where the steps of producing the transmitted beam, receiving and sensing the reflected beam, and determining the thickness of the oxide are accomplished between pulses of plasma enhanced oxide deposition.

* * * * *